United States Patent
Lee et al.

(10) Patent No.: US 6,916,511 B2
(45) Date of Patent: Jul. 12, 2005

(54) METHOD OF HARDENING A NANO-IMPRINTING STAMP

(75) Inventors: Heon Lee, Sunnyvale, CA (US);
Gun-Young Jung, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 201 days.

(21) Appl. No.: 10/279,407

(22) Filed: Oct. 24, 2002

(65) Prior Publication Data

US 2004/0081798 A1 Apr. 29, 2004

(51) Int. Cl.⁷ .................................................. H05H 1/24
(52) U.S. Cl. ........................ 427/569; 427/577; 427/578
(58) Field of Search ................................ 427/569, 577, 427/578, 249.1, 255.394

(56) References Cited

U.S. PATENT DOCUMENTS

| | | | |
|---|---|---|---|
| 5,468,071 A | * 11/1995 | Tourneux et al. | ........... 384/276 |
| 6,165,911 A | 12/2000 | Calveley | |
| 6,309,580 B1 | * 10/2001 | Chou | ........................ 264/338 |
| 6,515,339 B2 | * 2/2003 | Shin et al. | .................. 257/368 |
| 6,521,324 B1 | * 2/2003 | Debe et al. | ................. 156/235 |
| 6,673,714 B2 | 1/2004 | Lee et al. | |
| 6,713,396 B2 | 3/2004 | Anthony | |
| 6,743,368 B2 | * 6/2004 | Lee | .............................. 216/2 |
| 6,755,984 B2 | 6/2004 | Lee et al. | |
| 6,759,180 B2 | 7/2004 | Lee | |

* cited by examiner

*Primary Examiner*—Bret Chen
(74) *Attorney, Agent, or Firm*—Trueman H. Denny, III

(57) ABSTRACT

A method of forming a hardened nano-imprinting stamp is disclosed. The hardened nano-imprinting stamp includes a plurality of silicon-based nano-sized features that have an hardened shell of silicon carbide, silicon nitride, or silicon carbide nitride. The hardened shell is made harder than the underlying silicon by a plasma carburization and/or a plasma nitridation process. During the plasma process atoms of carbon and/or nitrogen bombard and penetrate a plurality of exposed surfaces of the nano-sized features and chemically react with the silicon to form the hardened shell of silicon carbide, silicon nitride, or silicon carbide nitride.

17 Claims, 9 Drawing Sheets

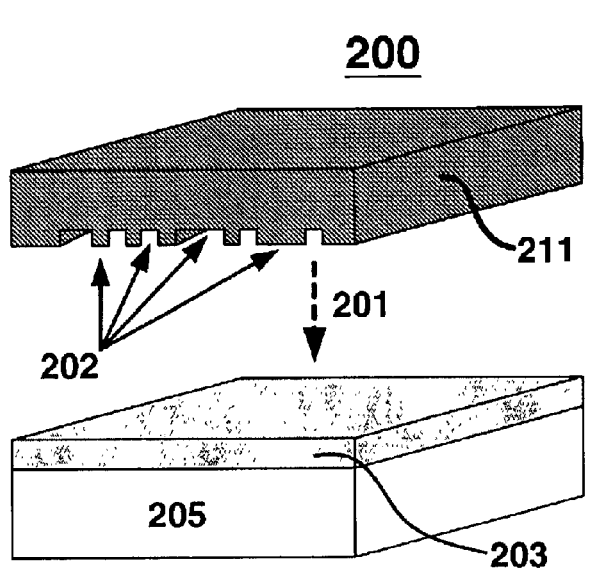
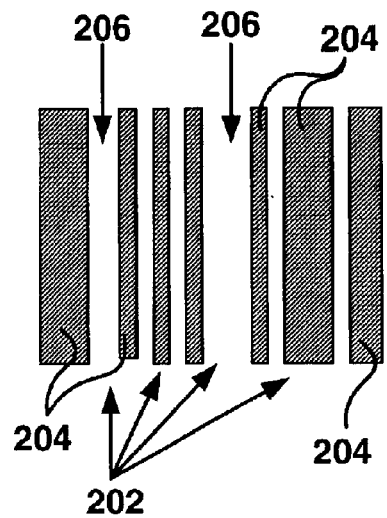
FIG. 1a (Prior Art)
FIG. 1b (Prior Art)
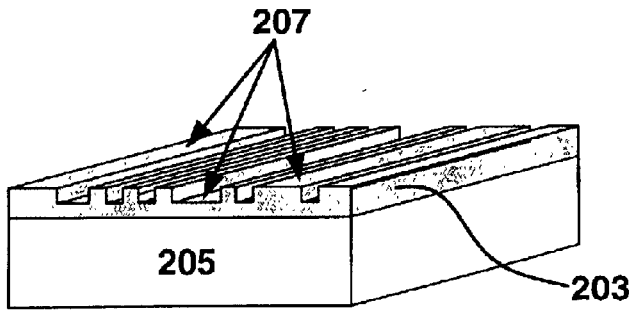
FIG. 2 (Prior Art)
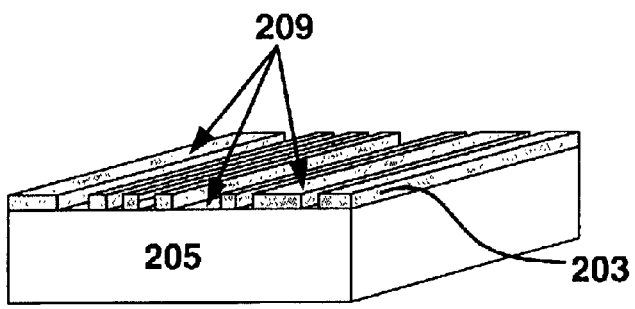
FIG. 3 (Prior Art)

200

200

METHOD OF HARDENING A NANO-IMPRINTING STAMP

FIELD OF THE INVENTION

The present invention relates generally to a structure and method of hardening a nano-imprinting stamp. More specifically, the present invention relates to a structure and method of hardening a nano-imprinting stamp using a plasma carburization and/or nitridation process.

BACKGROUND OF THE ART

Nano-imprinting lithography is a promising technique for obtaining nano-size (as small as a few tens of nanometers) patterns. A key step in forming the nano-size patterns is to first form an imprinting stamp that includes a pattern that complements the nano-sized patterns that are to be imprinted by the stamp.

In FIG. 1a, a prior nano-imprint lithography process includes an imprinting stamp 200 having a plurality of imprint patterns 202 formed thereon. In FIG. 1b, the imprint patterns 202 consists of a simple line and space pattern having a plurality of lines 204 separate by a plurality of spaces 206 between adjacent lines 204. The imprint patterns 202 are carried by a substrate 211. By pressing (see dashed arrow 201) the imprinting stamp 200 into a specially designed mask layer 203, a thickness of the mask layer 203 is modulated with respect to the imprint patterns 202 (see FIG. 1a) such that the imprint patterns 202 are replicated in the mask layer 203.

Typically, the mask layer 203 is made from a material such as a polymer. For instance, a photoresist material can be used for the mask layer 203. The mask layer 203 is deposited on a supporting substrate 205. Using a step and repeat process, the imprinting stamp 200 is pressed repeatedly onto the mask layer 203 to replicate the imprint patterns 202 in the mask layer 203 and to cover the whole area of the mask layer 203.

In FIG. 2, after the step and repeat process, the mask layer 203 includes a plurality of nano-size impressions 207 that complement the shape of the imprint patterns 202. Next, in FIG. 3, the mask layer 203 is anisotropically etched (i.e. a highly directional etch) to form nano-sized patterns 209 in the mask layer 203. Typically, the supporting substrate 205 or another layer (not shown) positioned between the mask layer 203 and the supporting substrate 205 serves as an etch stop for the anisotropic etch.

In FIG. 4, each line 204 includes opposed side surfaces 204s, a top surface 204t, opposed face surfaces 204f, and edges 204e. A space 206 separates each line 204. Typically, the imprint stamp 200 is made from a material such as silicon (Si). For example, the substrate 211 can be a silicon wafer and the line and space features (204, 206) can be made from silicon (Si) or polysilicon (α-Si). Silicon is the material of choice for nano-imprint stamps because there are well established microelectronics processes for manufacturing silicon based structures and circuits and silicon is readily available at a reasonable cost.

However, one of the disadvantages of the prior imprint stamp 200 is that silicon is a soft material and is subject to breakage, damage, and wear from repeated pressing steps into the mask layer 203. In FIG. 4, a section E—E of the line feature 204 is particularly subject to wear, damage, and breakage due to repeated pressing steps. In FIG. 5, an enlarged view of the section E—E of FIG. 4 illustrates that the edges 204e, the top surface 204t, the side surfaces 204s, and the face surfaces 204f are particularly susceptible to wear W from only a few pressing with the mask layer 203.

In FIG. 6, the imprint stamp 200 is pressed 201 into the mask layer 203 so that the line features 204 are disposed in the mask layer 203. Repeated pressing steps cause wear, damage, and breakage denoted as W at the edges 204e and the top surface 204t of the line features 204. Only ten or fewer pressing steps can result in the imprint stamp 200 wearing to the point where it can no longer be used to form consistent, repeatable, and accurate imprint patterns 209.

In FIGS. 7a and 7b, a more detailed view of the wear to the line features 204 illustrates that the wear is most severe along the edges 204e and top surface 204t as those portions of the line features 204 contact the mask layer 203 first and have surface features that are substantially normal to the direction of pressing 201. Accordingly, as illustrated in FIGS. 8a and 8b, the line feature 204 quickly deteriorates from the ideal line feature 204 of FIG. 8a to the worn out line features 204 of FIG. 8b after only a few pressing cycles with the mask layer 203.

Fabrication of the imprint stamp 200 is one of the most crucial and most expensive steps in the entire imprinting lithography process. Another disadvantage of the prior imprint stamp 200 is that a cost of manufacturing the imprint stamp 200 is not recouped because the imprint stamp 200 is damaged and/or wears out before an adequate number of pressing steps required to justify the manufacturing cost of the imprint stamp 200 can occur. Accordingly, the prior imprint stamp 200 is not economical to manufacture.

Consequently, there exists a need for a nano-size imprinting stamp that is resistant to wear, damage, and breakage. There is also an unmet need for a nano-size imprinting stamp that can retain consistent, repeatable, and accurate imprint patterns over multiple pressing cycles so that the cost of manufacturing the nano-size imprinting stamp is recovered.

SUMMARY OF THE INVENTION

The hardened nano-imprinting stamp of the present invention solves the aforementioned disadvantages and limitations of the prior nano-imprinting stamps. The silicon-based hardened nano-imprinting stamp of the present invention is made stronger and tougher by a plasma carburization and/or nitridation process that forms a hardened shell of silicon carbide (SiC), silicon nitride (SiN), or silicon carbide nitride (SiCN) along the outer surface of the hardened nano-imprinting stamp. The plasma carburization and/or nitridation process easily converts the reactive silicon (Si) material of the hardened nano-imprinting stamp into silicon carbide (SiC), silicon nitride (SiN), or silicon carbide nitride (SiCN) resulting in a hardened nano-size imprinting stamp that is much stronger than prior imprinting stamps made only of silicon.

The hardened nano-imprinting stamp has an increased lifetime and therefore the cost of manufacturing the hardened nano-imprinting stamp of the present invention can be recovered because the hardened nano-imprinting stamp can endure several more additional pressing cycles without wearing out, breaking, or being damaged, unlike the prior nano-imprinting stamps.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIGS. 1a and 1b are profile and top plan views respectively of a prior imprint stamp and prior imprint patterns.

FIG. 2 is a profile view of a prior mask layer with nano-size impression formed therein by the prior imprint stamp of FIG. 1a.

FIG. 3 is a profile view of the prior mask layer of FIG. 2 after an anisotropic etch step.

DETAILED DESCRIPTION

Figure 4:
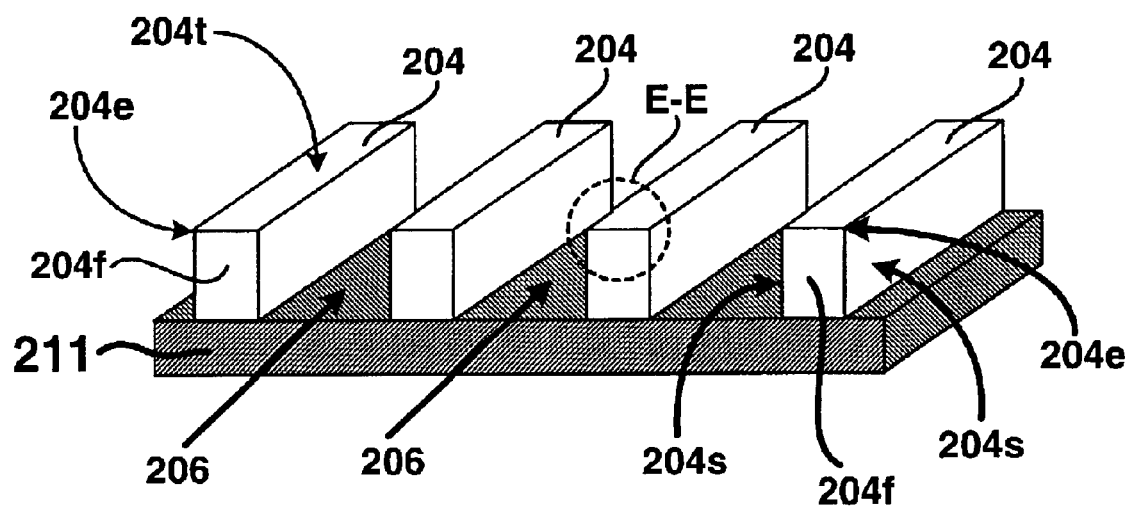
FIGS. 4 and 5 are a cross-sectional and profile views respectively that depict portions of a prior imprint stamp that are most susceptible to wear, breakage, or damage.
Figure 5:
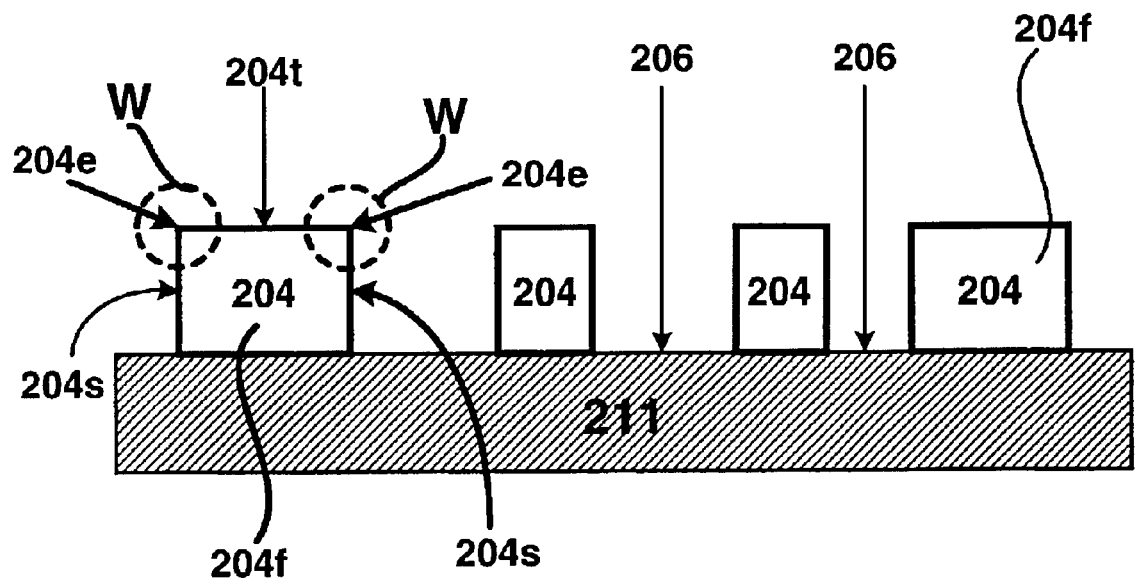
Figure 6:
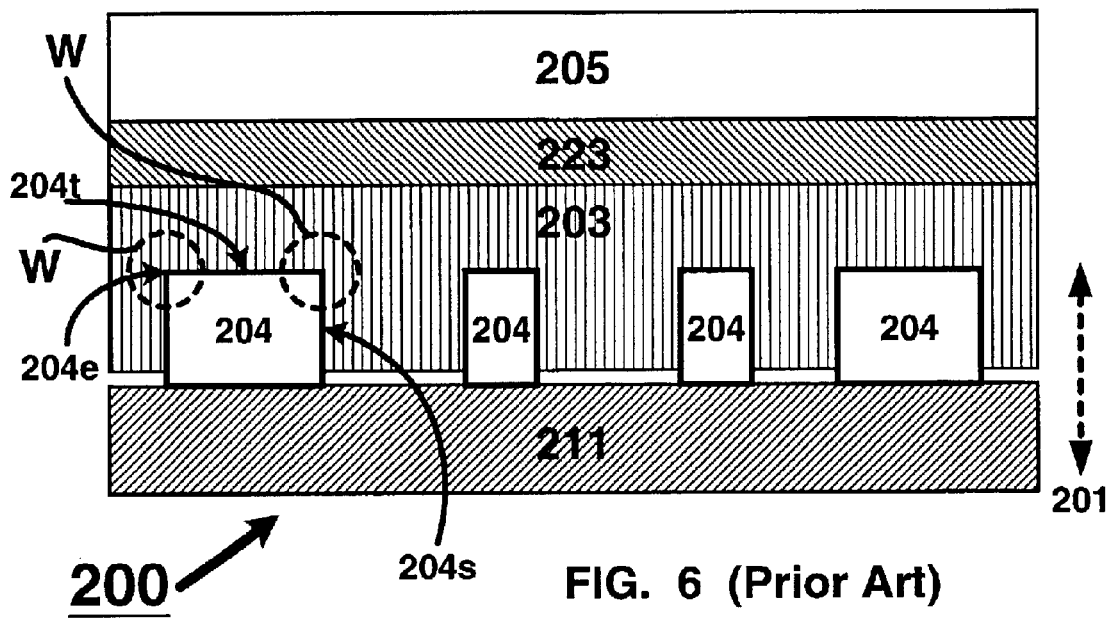
FIG. 6 is a cross-sectional view depicting a prior imprint stamp pressed into a mask layer.
Figures 7A, 7B:
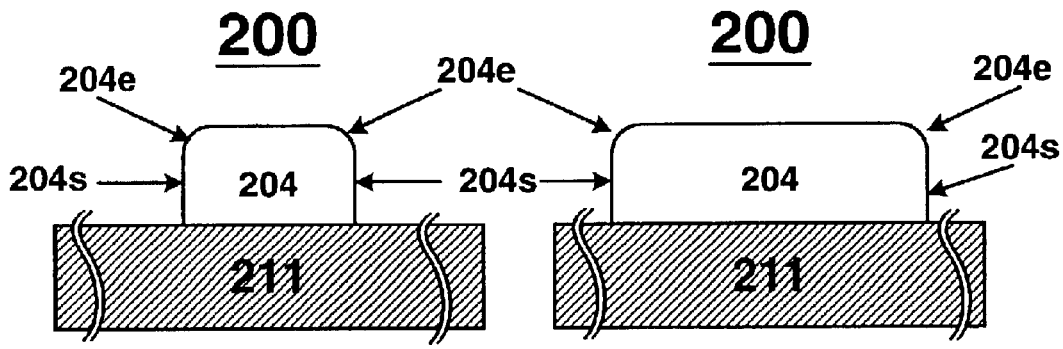
FIGS. 7a and 7b depict wear to the prior imprint stamp resulting from the pressing step of FIG. 6.
Figures 8A, 8B:
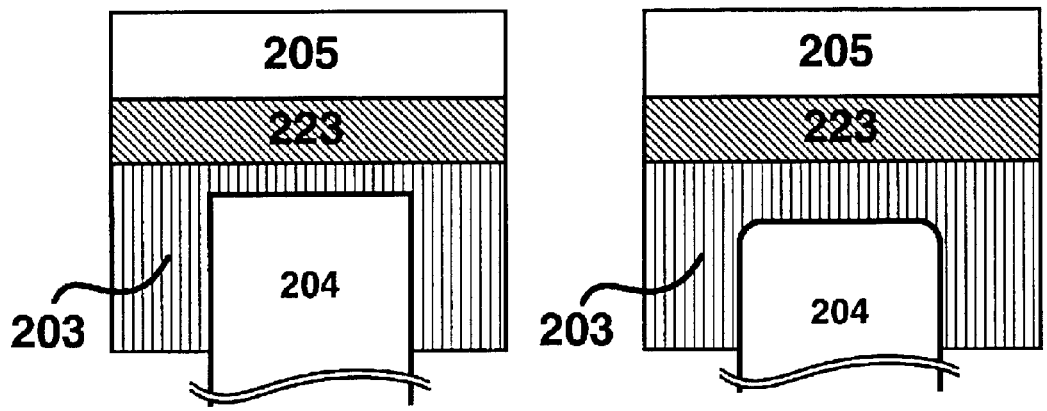
FIGS. 8a and 8b depict the rapid progression of wear to the prior imprint stamp after only a few pressing cycles.

In the following detailed description and in the several figures of the drawings, like elements are identified with like reference numerals.

As shown in the drawings for purpose of illustration, the present invention is embodied in a hardened nano-imprinting stamp and a method of making a hardened nano-imprinting stamp. The hardened nano-imprinting stamp comprises a plurality of silicon based nano-sized features that include a hardened shell formed by a plasma carburization and/or a plasma nitridation process. A plasma with a gas comprising carbon and/or nitrogen bombards exposed surfaces of the nano-sized features and penetrates those surfaces to react with the silicon to form a silicon carbide, a silicon nitride, or a silicon carbide nitride material. The atoms of carbon and/or nitrogen only penetrate the exposed surfaces to a finite depth so that only a portion of the silicon along the exposed surfaces is converted into an outer shell of the silicon carbide, silicon nitride, or the silicon carbide nitride material. As a result, the nano-sized features have a hardened outer shell (i.e. a hardened crust) that makes the nano-sized features more resilient to wear and damage due to repeated pressing cycles with a media to be imprinted by the nano-imprinting stamp.

The hardened nano-imprinting stamp of the present invention is cost effective because the hardened nano-sized features are durable and therefore have a longer service life that allows for the cost of manufacturing the hardened nano-imprinting stamp to be recovered before the service life has ended.

Additionally, the hardened nano-imprinting stamp of the present invention is more accurate than the prior nano-imprinting stamps because the hardened nano-sized features are more durable and maintain their imprint profiles over repeated pressing cycles with the media to be imprinted.

Figure 9:
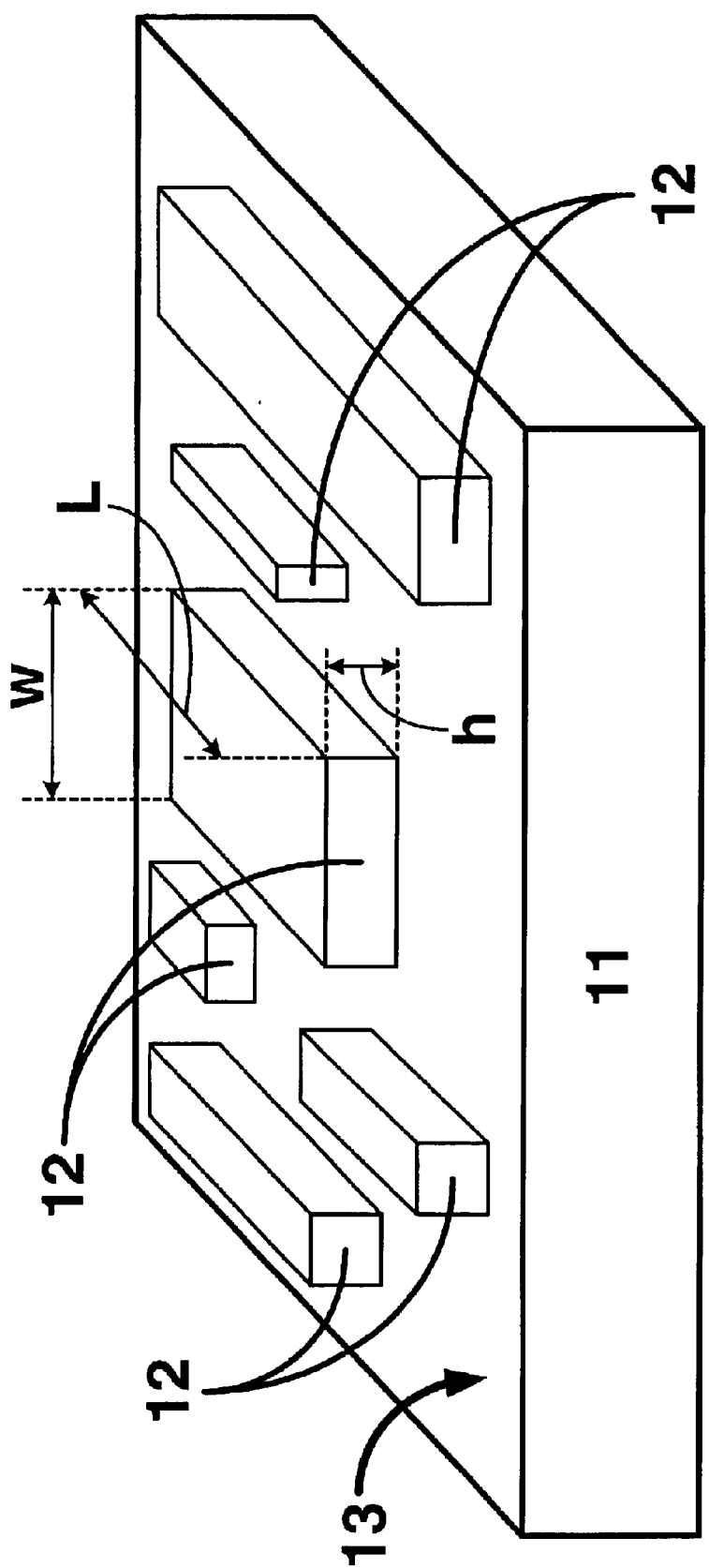
FIG. 9 is a profile view of a nano-imprinting stamp including a plurality of nano-sized features before a hardening process according to the present invention.

In FIG. 9, prior to a hardening process that will be described below, a substrate 11 includes a base surface 13 and a plurality of nano-sized features 12 that are in contact with the substrate 11 and extend outward of the base surface 13. The substrate 11 can be made from a material including but not limited to silicon (Si), single crystal silicon, poly-silicon ($\alpha$-Si), silicon oxide ($SiO_2$), and silicon nitride ($SiN_x$). For example, the substrate 11 can be a wafer of single crystal silicon such as the type commonly used for the fabrication of microelectronic devices and structures.

The nano-sized features 12 have dimensions (i.e. a width w and a height h) that are typically in a range of about 1.0 $\mu$m or less. A length L of the nano-sized features 12 may also be about 1.0 $\mu$m or less. Dimensions of a few hundred nanometers or less are desirable. The nano-sized features 12 can be made from a silicon-based material including but not limited to silicon (Si) and polysilicon ($\alpha$-Si). For example, using well understood microelectronics processing techniques, the nano-sized features 12 can be formed by depositing a layer of polysilicon (not shown) on the base surface 13 of the substrate 11 followed by lithographically patterning the layer of polysilicon with a mask layer and then etching through the mask layer to form the nano-sized features 12 of polysilicon.

The nano-sized features 12 include an outer surface that defines an imprint profile. For instance, in FIG. 9, the nano-sized features 12 have an outer surface that defines a rectangular imprint profile. Accordingly, when the substrate 11 is pressed into contact with a media to be imprinted (not shown) the imprint profile of the nano-sized features 12 is transferred to the media. The imprint profile of the nano-sized features 12 will be application dependent and the present invention is not limited by the imprint profiles of the nano-sized features 12 as illustrated herein.

Figure 10A:
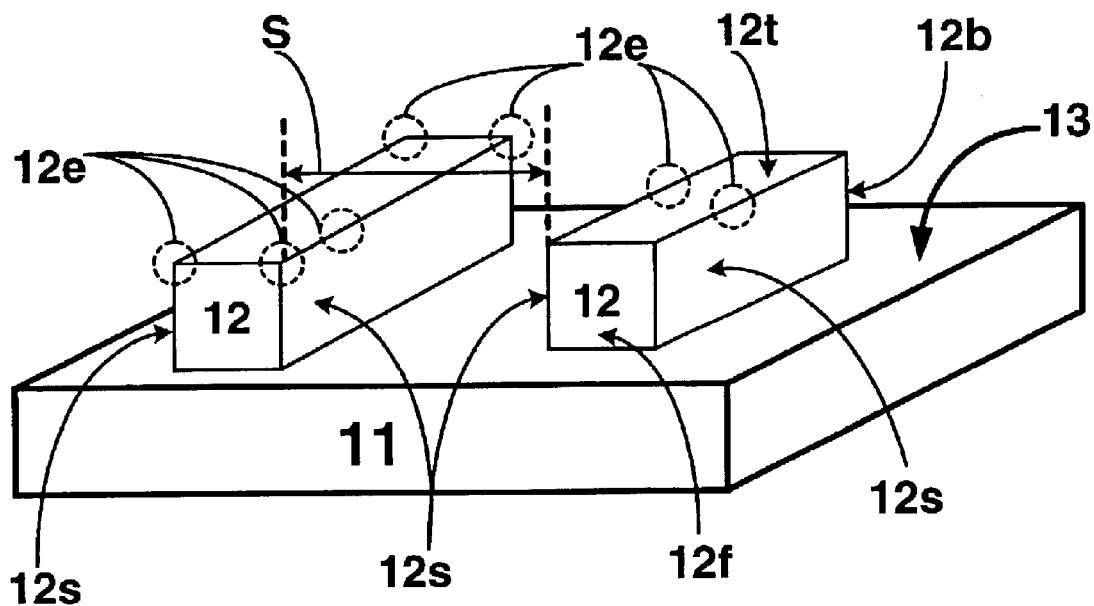
FIG. 10a is a profile view depicting exposed edges and surfaces of the nano-sized features of FIG. 9.

In FIG. 10a, the outer surfaces of the nano-sized features 12 includes opposed side surfaces 12s, a top surface 12t, a front surface 12f, a back surface 12b, edge surfaces 12e, and the base surface 13. All of the aforementioned surfaces can be exposed surfaces that are subject to wear, damage, or breakage resulting from one or more pressing cycles in a nano-imprint lithography process.

The edge surfaces 12e are particularly susceptible to wear and damage. Moreover, the nano-sized features 12 are spaced apart from one another by a spacing S that can vary among the nano-sized features 12. That spacing S is also transferred to the media in which the nano-sized features 12 are imprinted. Accordingly, wear to the side surfaces 12s will cause the spacing S to increase thereby reducing the accuracy of the imprint. Wear or damage to the base surface 13 can also result in a reduction in accuracy of the imprint. Essentially, the imprint profile and the accuracy of the imprint made by the nano-sized features 12 depends on the mechanical stability (i.e. toughness) of the exposed surfaces and edges.

Figure 10B:
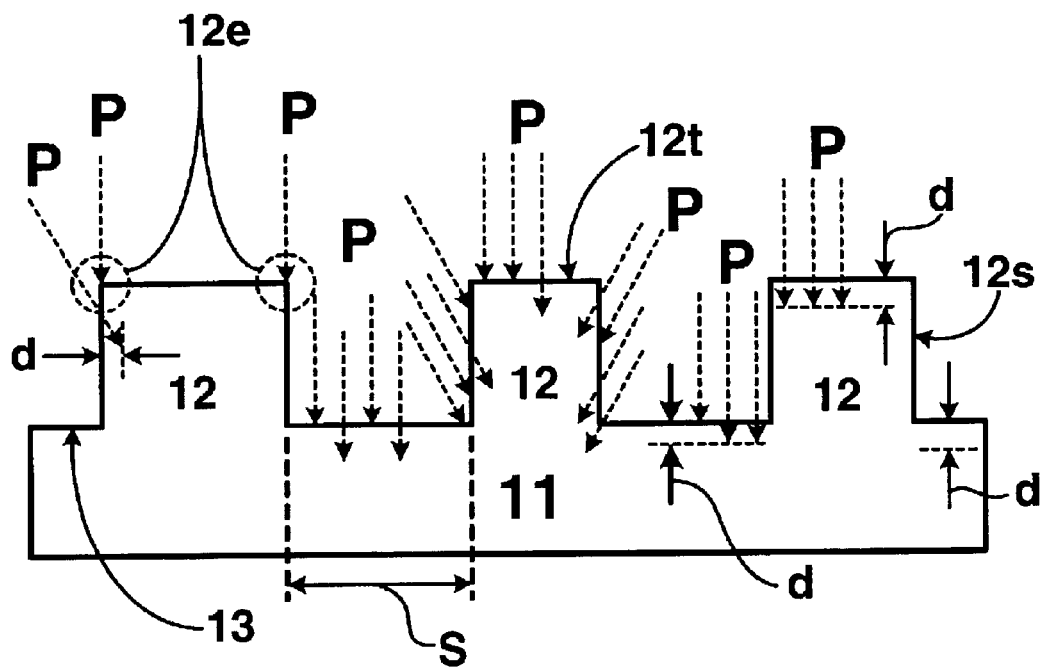
FIG. 10b is a cross-sectional view depicting a plasma hardening process for hardening the exposed edges and surfaces of FIG. 10a according to the present invention.

In FIG. 10b, the aforementioned outer surfaces (12s, 12e, 12t, 12f, 12b) of the nano-sized features 12 and the base surface 13 are exposed to a plasma P. The plasma P bombards those surfaces and atoms of a material in the plasma P penetrates those surfaces to a predetermined depth d. The atoms of carbon (C) and/or nitrogen ($N_2$) can penetrate the exposed surfaces through a mechanism such a diffusion, for example. The plasma P comprises a gas that includes carbon (C) for a plasma carburization process, nitrogen ($N_2$) for a plasma nitridation process, and carbon (C) and nitrogen ($N_2$) for a plasma carburization and nitridation process. Accordingly, either carbon atoms and/or nitrogen atoms penetrate those surfaces to the predetermined depth d and chemically react with the material of the nano-sized features 12. The predetermined depth d can vary along the aforementioned surfaces and need not be equal along all of the surfaces. For example, the predetermined depth d may be greater (i.e deeper) on the top surface 12t and base surface 13 than it is on the side surfaces 12s.

Figure 11:
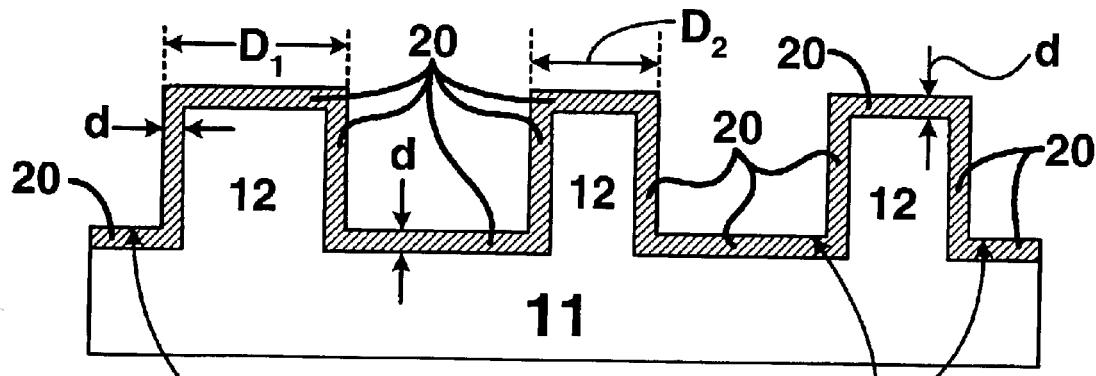
FIG. 11 is a cross-sectional view of a hardened shell of a hardened nano-imprinting stamp according to the present invention.

In FIG. 11, a hardened nano-imprinting stamp 10 results from the plasma carburization process, plasma nitridation process, or plasma carburization and nitridation processes. As a result of those plasma processes, the nano-sized features 12 include a hardened shell 20 that extends inward of the outer surface to the predetermined depth d. The hardened shell 20 comprises silicon carbide (SiC) when the plasma process is the plasma carburization process. Conversely, the hardened shell 20 comprises silicon nitride (SiN) when the plasma process is the plasma nitridation process. If both the plasma carburization process and the plasma nitridation process are used, then the hardened shell 20 comprises silicon carbide nitride (SiCN). The resulting silicon carbide hardened shell 20, silicon nitride hardened shell 20, or silicon carbide nitride hardened shell 20 is harder and more resilient to wear, damage, and breakage than an underlying core of softer silicon-based material that lies beneath the hardened shell 20 of the nano-sized features 12. Essentially, the hardened shell 20 forms an outrer hardened crust of SiC, SiN, or SiCN that surrounds an underlying core of the softer silicon (Si) based material. Consequently, the imprint profile of the nano-sized features 12 is maintained after repeated engagements of the hardened nano-imprinting stamp 10 with a media that is to be imprinted by the hardened nano-imprinting stamp 10.

The predetermined depth d will be application dependent and can be determined by factors that include processing time and temperature, just to name a few. The predetermined depth d is small relative to the dimensions of the nano-sized features 12. For example, a width dimension of the nano-sized features 12 (see $D_1$ and $D_2$ in FIG. 11) can be on the order of a few hundred nanometers. On the other hand, the predetermined depth d can be on the order of a few hundred angstroms (Å). The predetermined depth d of the hardened shell 20 can be in a range from about 10.0 Å to about 300.0 Å. However, for the embodiments described herein, the predetermined depth d is not to be construed as being limited to that range, and as was stated above, the predetermined depth d is application specific.

Figure 14:
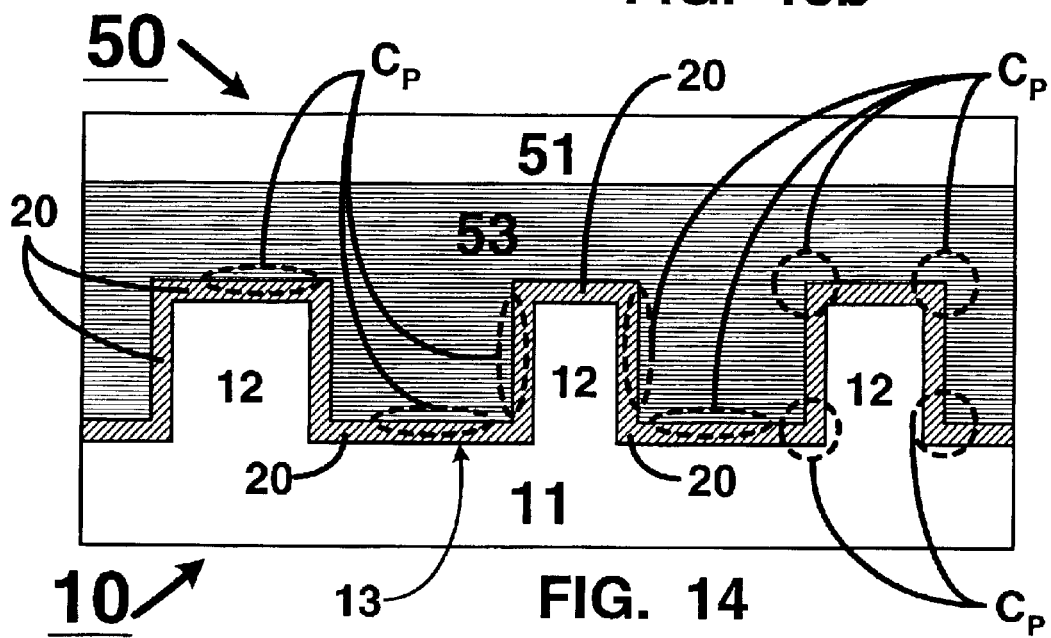
FIG. 14 is a cross-sectional view depicting a hardened nano-imprinting stamp pressed into contact with a mask layer according to the present invention.

In FIG. 14, the hardened nano-imprinting stamp 10 is pressed into contact with an imprint target 50 that includes a support substrate 51 and an imprint media 53. The imprint media 53 can be made from a variety of materials. For example, the imprint media 53 can be a polymer such as a photoresist material used for photolithography. The nano-sized features 12 of the hardened nano-imprinting stamp 10 are pressed into the imprint media 53 to form an imprint that complements the imprint profiles of the nano-sized features 12. The aforementioned exposed surfaces are in contact $C_p$ with the imprint media 53 and those points of contact $C_p$ are resistant to wear and damage due to the hardened shell 20.

Figure 16:
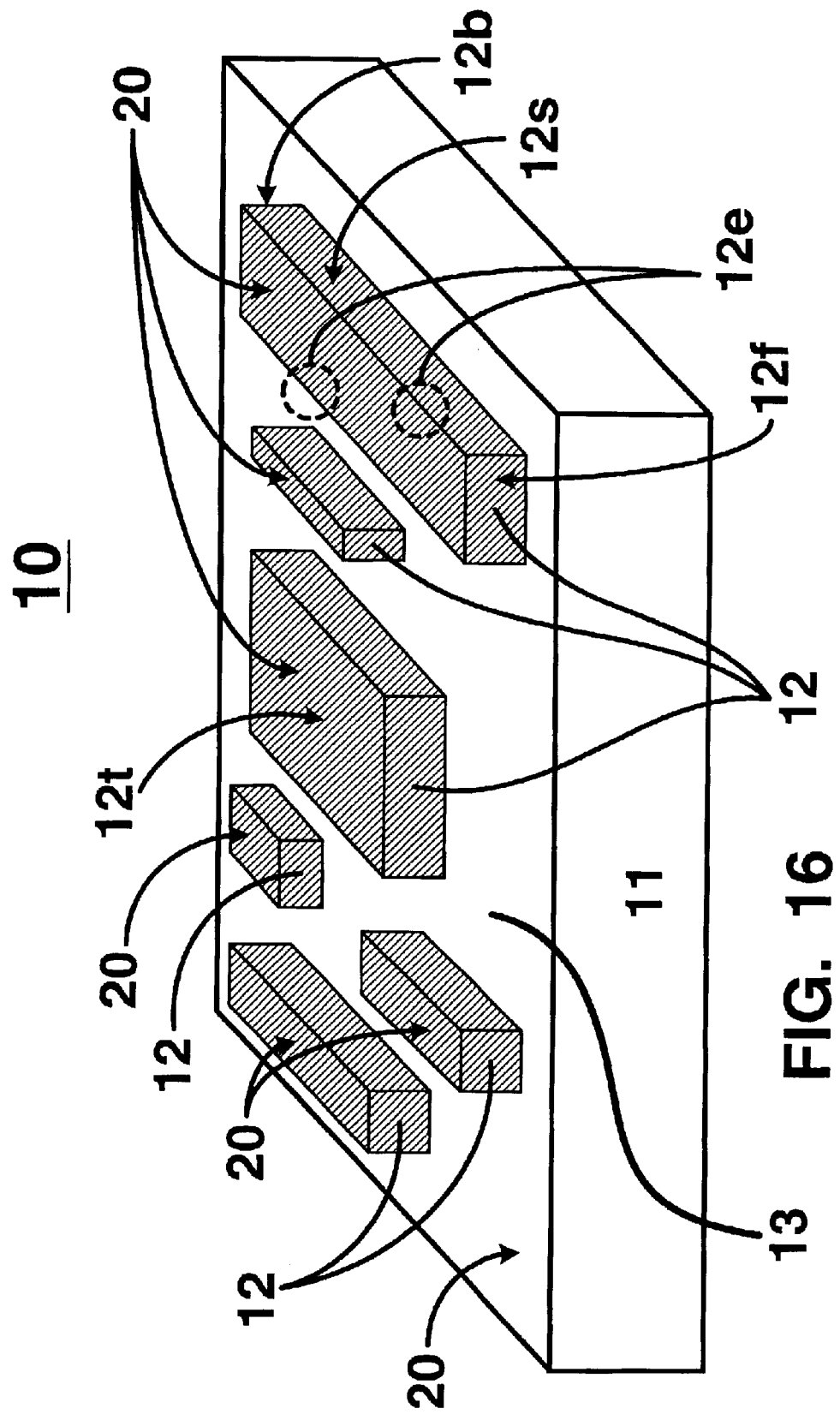
FIG. 16 is a profile view of a hardened nano-imprinting stamp including a plurality of hardened nano-sized features according to the present invention.

Accordingly, the surfaces of the hardened nano-imprinting stamp 10 that will come into contact with the imprint media 53 are hardened against wear and damage, as is illustrated in FIG. 16, where the exposed surfaces (12s, 12e, 12t, 12f, 12b shown in cross-hatched line) of the nano-sized features 12 and the base surface 13 include the hardened shell 20. Because wearing out of the nano-sized features 12 is closely related with a hardness of the material for the nano-sized features 12, a useful lifetime of the hardened nano-imprinting stamp 10 of the present invention can be increased by a factor of ten or more.

Figure 12A:
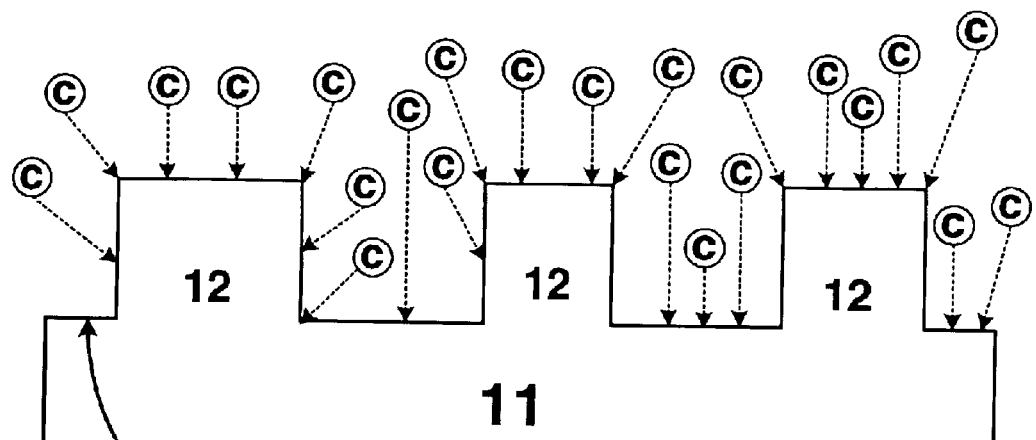
FIGS. 12a and 12b are schematic views depicting a plasma carburization process for forming a hardened shell according to the present invention.
Figure 12B:
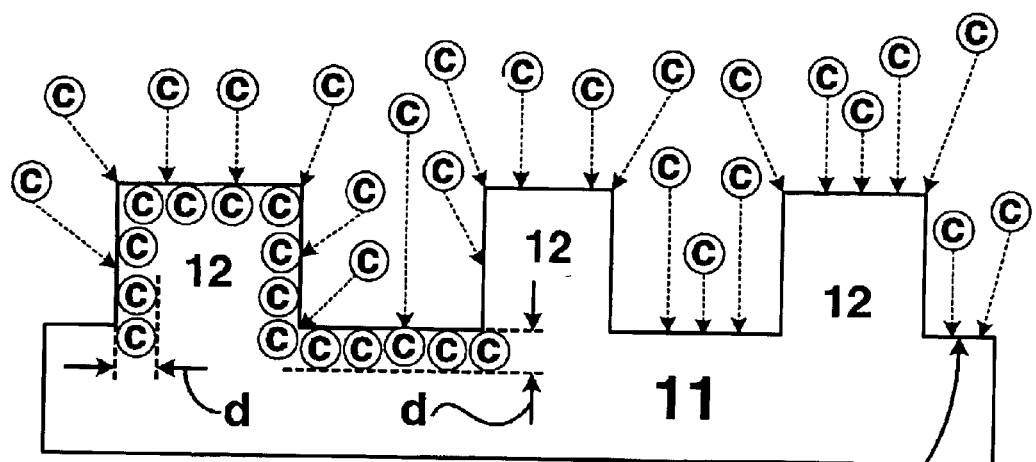

FIGS. 12a and 12b illustrate a method of hardening a nano-imprinting stamp 10 using a plasma carburization process. In FIG. 12a, the nano-imprinting stamp 10 includes a plurality of silicon-based nano-sized features 12 that are carried by a substrate 11. The nano-sized features 12 include a plurality of exposed surfaces (see 12s, 12e, 12t, 12f, 12b, and 13 in FIGS. 10a and 10b). The nano-sized features 12 can be made from a material including but not limited to silicon (Si) and polysilicon ($\alpha$-Si).

The nano-sized features 12 are carburized in a plasma that includes a carbon (C) containing gas (denoted as an encircled C in FIG. 12a). In FIG. 12b, atoms of the carbon C bombard the exposed surfaces and penetrate into those surfaces. The atoms of the carbon C chemically react with the silicon of the nano-sized features 12 to form silicon carbide (SiC).

The carburizing continues until a hardened shell 20 of silicon carbide (SiC) forms on the exposed surfaces and extends inward of those surfaces to the predetermined depth d. Resulting is the hardened nano-imprinting stamp 10 described above in reference to FIGS. 11, 14, and 16.

The carbon containing gas can be a hydrocarbon including but not limited to methane ($CH_4$) and ethane ($C_2H_6$). The plasma carburization process can occur at a temperature in a range from about 300° C. to about 900° C.

Figure 13A:
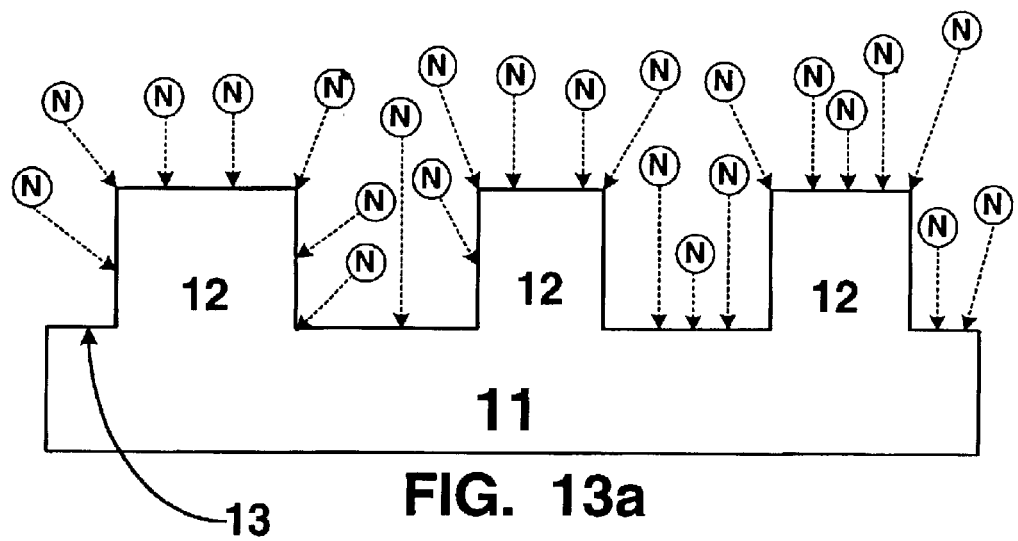
FIGS. 13a and 13b are schematic views depicting a plasma nitridation process for forming a hardened shell according to the present invention.
Figure 13B:
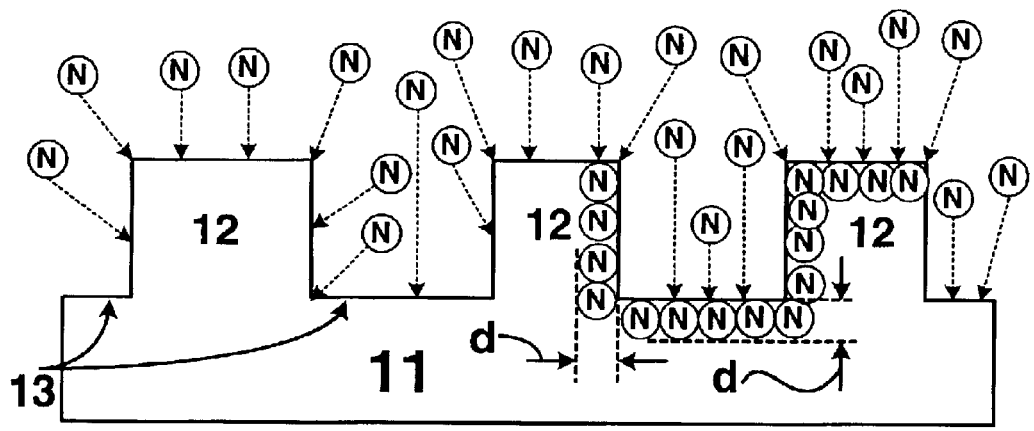

Similarly, FIGS. 13a and 13b illustrate a method of hardening a nano-imprinting stamp 10 using a plasma nitridation process. In FIG. 13a, the nano-imprinting stamp 10 includes a plurality of silicon-based nano-sized features 12 that are carried by a substrate 11. The nano-sized features 12 include a plurality of exposed surfaces (see 12s, 12e, 12t, 12f, 12b, and 13 in FIGS. 10a and 10b). The nano-sized features 12 can be made from a material including but not limited to silicon (Si) and polysilicon ($\alpha$-Si).

The nano-sized features 12 are nitridized in a plasma that includes a nitrogen ($N_2$) containing gas (denoted as an encircled N in FIG. 13a). In FIG. 13b, atoms of the nitrogen N bombard the exposed surfaces and penetrate into those surfaces. The atoms of the nitrogen N chemically react with the silicon of the nano-sized features 12 to form silicon nitride (SiN).

The nitridizing continues until a hardened shell 20 of silicon nitride forms on the exposed surfaces and extends inward of those surfaces to the predetermined depth d. Resulting is the hardened nano-imprinting stamp 10 described above in reference to FIGS. 11, 14, and 16.

The nitrogen containing gas can be a material including but not limited to nitrogen ($N_2$) or ammonia ($NH_3$). The plasma nitridation process can occur at a temperature including but not limited to room temperature (i.e. 25° C.) or a temperature that is above room temperature.

Figure 15A:
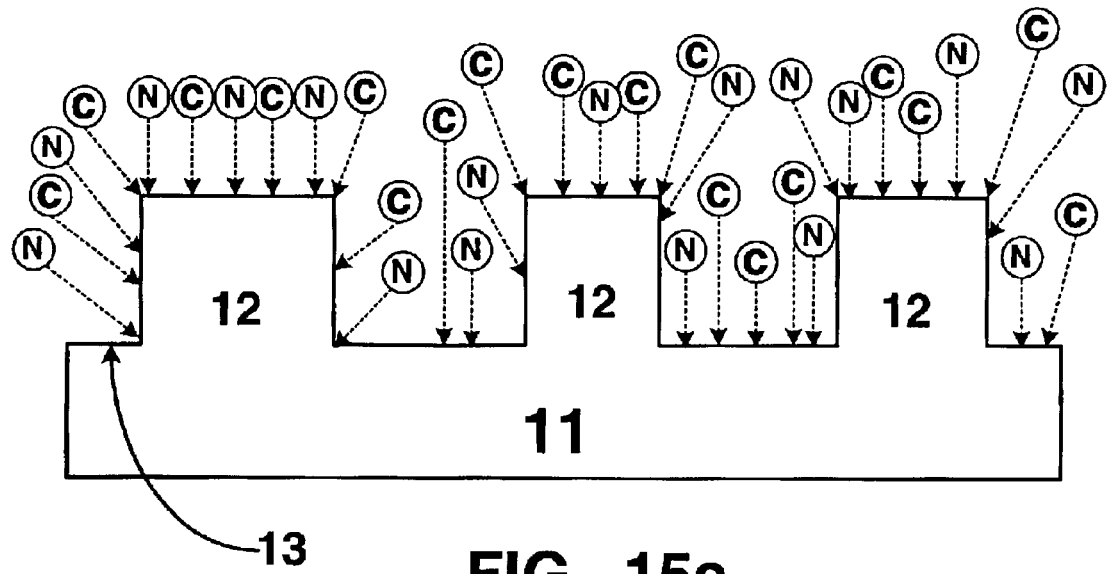
FIGS. 15a and 15b are schematic views depicting a plasma carburization process and a plasma nitridation process for forming a hardened shell according to the present invention.
Figure 15B:
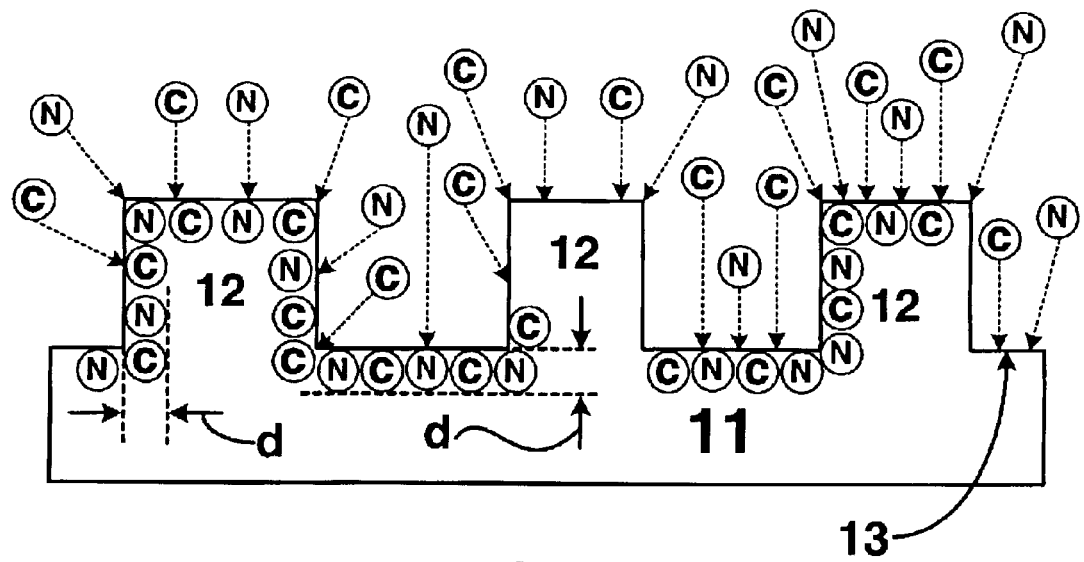

FIGS. 15a and 15b illustrate a method of hardening a nano-imprinting stamp 10 using a plasma carburization process and a plasma nitridation process. In FIG. 15a, the nano-imprinting stamp 10 includes a plurality of silicon-based nano-sized features 12 that are carried by a substrate 11. The nano-sized features 12 include a plurality of exposed surfaces (see 12s, 12e, 12t, 12f, 12b, and 13 in FIGS. 10a and 10b). The nano-sized features 12 can be made from a material including but not limited to silicon (Si) and poly-silicon (α-Si).

The nano-sized features 12 are carburized in a plasma that includes a carbon (C) containing gas (denoted as an encircled C in FIG. 15a) and nitridized in a plasma that includes a nitrogen ($N_2$) containing gas (denoted as an encircled N in FIG. 15a). In FIG. 15b, atoms of the carbon C and the nitrogen N bombard the exposed surfaces and penetrate into those surfaces. The atoms of the carbon C and nitrogen N chemically react with the silicon of the nano-sized features 12 to form silicon carbide nitride (SiCN). The carburizing and nitridizing continues until a hardened shell 20 of silicon carbide nitride (SiCN) forms on the exposed surfaces and extends inward of those surfaces to the predetermined depth d. Resulting is the hardened nano-imprinting stamp 10 described above in reference to FIGS. 11, 14, and 16.

The carbon containing gas can be a hydrocarbon including but not limited to methane ($CH_4$) and ethane ($C_2H_6$). The plasma carburization process can occur at an elevated temperature in a range from about 300° C. to about 900° C. The nitrogen containing gas can be a material including but not limited to nitrogen ($N_2$) or ammonia ($NH_3$). The plasma nitridation process can occur at a temperature including but not limited to room temperature (i.e. 25° C.) or a temperature that is above room temperature. The plasma carburization process can occur first followed by the plasma nitridation process or vice-versa. The plasma carburization process and the plasma nitridation process can occur substantially at the same time in a plasma that includes a carbon (C) containing gas and a nitrogen ($N_2$) containing gas. Those gasses (C, $N_2$) can be mixed together (i.e. premixed) before introduction into a chamber in which the plasma carburization and plasma nitridation will occur.

Although several embodiments of the present invention have been disclosed and illustrated, the invention is not limited to the specific forms or arrangements of parts so described and illustrated. The invention is only limited by the claims.

What is claimed is:

1. A method of hardening a nano-imprinting stamp including a plurality of silicon-based nano-sized features carried by a substrate, comprising:
    carburizing of the nano-sized features in a plasma including a carbon containing gas so that the carbon penetrates into a plurality of exposed surfaces of the nano-sized features; and
    continuing the carburizing until a hardened shell of silicon carbide forms on the exposed surfaces and the hardened shell extends inward of the exposed surfaces to a predetermined depth.

2. The method of hardening a nano-imprinting stamp as set forth in claim 1, wherein the carbon containing gas comprises a hydrocarbon selected from the group consisting of methane and ethane.

3. The method of hardening a nano-imprinting stamp as set forth in claim 1, wherein the carburizing occurs at a temperature from about 300 degrees centigrade to about 900 degrees centigrade.

4. The method of hardening a nano-imprinting stamp as set forth in claim 1, wherein the carburizing is continued until the predetermined depth is in a range from about 10.0 angstroms to about 300.0 angstroms.

5. A method of hardening a nano-imprinting stamp including a plurality of silicon-based nano-sized features carried by a substrate, comprising:
    nitridizing of the nano-sized features in a plasma including a nitrogen containing gas so that the nitrogen penetrates into a plurality of exposed surfaces of the nano-sized features; and
    continuing the nitridizing until a hardened shell of silicon nitride forms on the exposed surfaces and the hardened shell extends inward of the exposed surfaces to a predetermined depth.

6. The method of hardening a nano-imprinting stamp as set forth in claim 5, wherein the nitridizing occurs at a temperature selected from the group consisting of room temperature, and a temperature that is above room temperature.

7. The method of hardening a nano-imprinting stamp as set forth in claim 5, wherein the nitridizing is continued until the predetermined depth is in a range from about 10.0 angstroms to about 300.0 angstroms.

8. The method of hardening a nano-imprinting stamp as set forth in claim 5, wherein the nitrogen containing gas is a material selected from the group consisting of nitrogen and ammonia.

9. A method of hardening a nano-imprinting stamp including a plurality of silicon-based nano-sized features carried by a substrate, comprising:
    carburizing of the nano-sized features in a plasma including a carbon containing gas so that the carbon penetrates into a plurality of exposed surfaces of the nano-sized features;
    nitridizing of the nano-sized features in a plasma including a nitrogen containing gas so that the nitrogen penetrates into a plurality of exposed surfaces of the nano-sized features; and
    continuing the carburizing and the nitridizing until a hardened shell of silicon carbide nitride forms on the exposed surfaces and the hardened shell extends inward of the exposed surfaces to a predetermined depth.

10. The method of hardening a nano-imprinting stamp as set forth in claim 9, wherein the carbon containing gas comprises a hydrocarbon selected from the group consisting of methane and ethane.

11. The method of hardening a nano-imprinting stamp as set forth in claim 9, wherein the nitrogen containing gas is a material selected from the group consisting of nitrogen and ammonia.

12. The method of hardening a nano-imprinting stamp as set forth in claim 9, wherein the carburizing occurs at a temperature from about 300 degrees centigrade to about 900 degrees centigrade.

13. The method of hardening a nano-imprinting stamp as set forth in claim 9, wherein the nitridizing occurs at a temperature selected from the group consisting of room temperature, and a temperature that is above room temperature.

14. The method of hardening a nano-imprinting stamp as set forth in claim 9, wherein the carburizing and the nitridizing are continued until the predetermined depth is in a range from about 10.0 angstroms to about 300.0 angstroms.

15. The method of hardening a nano-imprinting stamp as set forth in claim 9, wherein the carburizing occurs before the nitridizing.

16. The method of hardening a nano-imprinting stamp as set forth in claim 9, wherein the nitridizing occurs before the carburizing.

17. The method of hardening a nano-imprinting stamp as set forth in claim 9, wherein the carburizing and the nitridizing occur substantially at the same time.

* * * * *